United States Patent [19]

Gamand et al.

[11] Patent Number: 5,089,717
[45] Date of Patent: Feb. 18, 1992

[54] INTERGRATED SEMICONDUCTOR DEVICE INCLUDING A FREQUENCY DIVIDER FOR MICROWAVE APPLICATIONS

[75] Inventors: Patrice Gamand, Yerres; Bertrand Gabillard, Paris, both of France

[73] Assignee: U.S. Philips Corporation, New York, N.Y.

[21] Appl. No.: 711,551

[22] Filed: May 16, 1991

Related U.S. Application Data

[63] Continuation-in-part of Ser. No. 458,925, Dec. 29, 1989, abandoned.

[30] Foreign Application Priority Data

Dec. 30, 1988 [FR] France ................... 88 17495

[51] Int. Cl.[5] ................................. H03K 21/02
[52] U.S. Cl. .................. 307/219.1; 328/25; 331/51; 331/115; 377/47
[58] Field of Search ............. 377/127, 128, 47, 121; 331/51, 107 T, 115; 307/219.1; 328/25

[56] References Cited

U.S. PATENT DOCUMENTS

| | | | |
|---|---|---|---|
| 2,594,336 | 4/1952 | Mohr | 377/127 |
| 2,985,770 | 5/1961 | Kneisel | 377/127 |
| 3,119,983 | 1/1964 | Carroll et al. | 377/126 |
| 3,629,727 | 12/1971 | Berney | 331/51 |
| 3,671,880 | 6/1972 | Kuiper et al. | 328/25 |
| 3,997,796 | 12/1976 | Sanders et al. | 307/219.1 |
| 4,621,239 | 11/1986 | Tserng | 331/115 |
| 4,630,003 | 12/1986 | Torizuka et al. | 331/115 |
| 4,638,180 | 1/1987 | Sagawa et al. | 307/219.1 |
| 4,695,940 | 9/1987 | Rein | 328/25 |

Primary Examiner—John S. Heyman
Attorney, Agent, or Firm—Bernard Franzblau

[57] ABSTRACT

An integrated semiconductor device including a frequency divide-by-two circuit comprising an inverter stage and a switching transistor (T2) which is controlled by a microwave input signal (E). The divider circuit includes an oscillator stage in that the inverter stage is at least equipped with a reactive element which in combination with the inverter stage forms a negative resistant network. The switching transistor is connected in parallel with this reactive element and the transmit time $\tau_0$ of the switch is less than the transit time $\tau_2$ of a signal propagating through the reactive element.

20 Claims, 2 Drawing Sheets

INTEGRATED SEMICONDUCTOR DEVICE INCLUDING A FREQUENCY DIVIDER FOR MICROWAVE APPLICATIONS

This is a continuation-in-part of application Ser. No. 07/458,925, filed Dec. 29, 1989, now abandoned.

BACKGROUND OF THE INVENTION

This invention relates to an integrated semiconductor device including a frequency divide-by-two circuit which comprises an inverter stage $P_1$ and a switch $T_2$ which is controlled by an input signal E at the frequency $f_0$.

The invention is used in the construction of integrated microwave circuits on gallium arsenide, in particular in the construction of stabilized frequency sources or of programmable dividers permitting the synthesis of a set of stabilized frequencies.

It is generally known from the prior art that a frequency divide-by-two circuit constructed in dynamic mode, comprising an inverter stage, a follower stage and a switch stage, is limited by the propagation time (tpd) of a gate.

Such a divider circuit is described in the publication entitled "26 GHz GaAs Room-Temperature Dynamic Divider Circuit" by J. F. Jensen, L. G. Salmon et al in "GaAs Ic Symposium, pp. 201-204" ref. CH 2506-4/87/0000-0201, 1987 IEEE.

This document relates to a frequency divide-by-two circuit operating dynamically and which is based on the use of depletion field-effect transistors exhibiting a pinch-off voltage of approximately $-2.5$ V. This divider is composed of two stages (see FIG. 5 of the cited document).

The first stage is formed by a switching transistor controlled by a first clock signal $\phi$, followed by an inverter gate of BFD type. The second stage is formed by a switching transistor controlled by a second, complementary clock signal $\bar{\phi}$ followed by a follower gate.

This known circuit exhibits the advantage of being capable of being constructed by means of a small number of transistors. However, in the technical field of applications envisaged, it still exhibits a certain number of disadvantages. In particular, the maximum frequency is limited by the propagation time of the two gates, this maximum frequency being expressed by the relation $$F_{max} = \tfrac{1}{4} tpd.$$

As the logic states are stored by charging or by discharging the gate capacitors of the inverter and follower transistors, the results of this is that charge propagation times (tpd) of less than 15 ps, which are required in order to divide signals emitted at frequencies greater than 30 GHz, are impossible to obtain in the present state of the art by means of this type of divider.

Another type of divider is known which makes use of a concept of regenerating capacity of a signal. This principle necessitates an amplification, the mixing, a feedback at the divided frequency and a filtering. Such a circuit is described in the publication entitled "Regenerative Frequency Division with a GaAs FET" by C. RAUSHER in "IEEE Transactions on Microwave Theory and Techniques, vol. MTT-32, No. 11, November 1984, pp. 1461-1468". The principal limitations of this known circuit reside in the fact that the transistor must be biased close to its pinch-off voltage in order to obtain the mixing which is necessary for the operation of the divider. This necessitates rather precise regulating components. Furthermore, this known circuit exhibits conversion losses.

SUMMARY OF THE INVENTION

An object of the present invention is to provide a circuit which lacks the aforementioned disadvantages.

According to the invention, this object is achieved by means of the device defined in the preamble and moreover characterized in that the inverter comprises a transistor $T_1$ equipped with tuning impedances and with a reactive impedance element $z_f$ connected together to form a negative resistance. Furthermore, a switch $T_2$ is connected in parallel with the reactive element $z_f$. The negative resistance is achieved by using a feedback network connected to the active device, i.e. the transistor $T_1$. The feedback network can be a capacitance, an inductance, or a combination of capacitance and inductance. The impedance Z of this circuit has a negative resistance. The negative resistance is used to generate the oscillation because, during a part of a cycle, the negative resistance effectively operates as a power source. The transit $\tau_0$ of the switch $T_2$, the delay time $\tau_1$ for the propagation of a signal from the control electrode (gate) to a main electrode (e.g. drain) of the inverter transistor $T_1$ and the delay time $\pi_2$ of a signal propagating through the impedance element are connected by the three relations:

$$\pi_2 > \tau_0$$

$$(\tau_0 + \tau_1) < 1/f_0 < 2(\tau_0 + \tau_1)$$

$$(\tau_1 + \tau_2) > 1/f_0$$

Under these conditions, the device according to the invention exhibits, inter alia, the following advantages:
- it requires the use only of a single input signal;
- it does not require any precise regulating means for biasing the transistor;
- it exhibits a maximum frequency which is greater than that of the known devices of the prior art. According to the invention, this maximum frequency may theoretically reach the value $F_{max} = \tfrac{1}{2}\tau_0$, where $\tau_0$ is the transit time of the carriers under the gate of the inverter transistor. This may lead to frequencies greater than 60 GHz, i.e. virtually twice the limits of the prior art;
- it permits a conversion gain to be obtained when an output matching circuit is added to it.

It should be noted that it was already known to use an output matching circuit in the second cited document and that, nevertheless, conversion losses were obtained.

BRIEF DESCRIPTION OF THE DRAWINGS

The invention will be better understood by means of the following description, illustrated by the accompanying drawings in which.

DESCRIPTION OF THE PREFERED EMBODIMENTS

Figure 1:
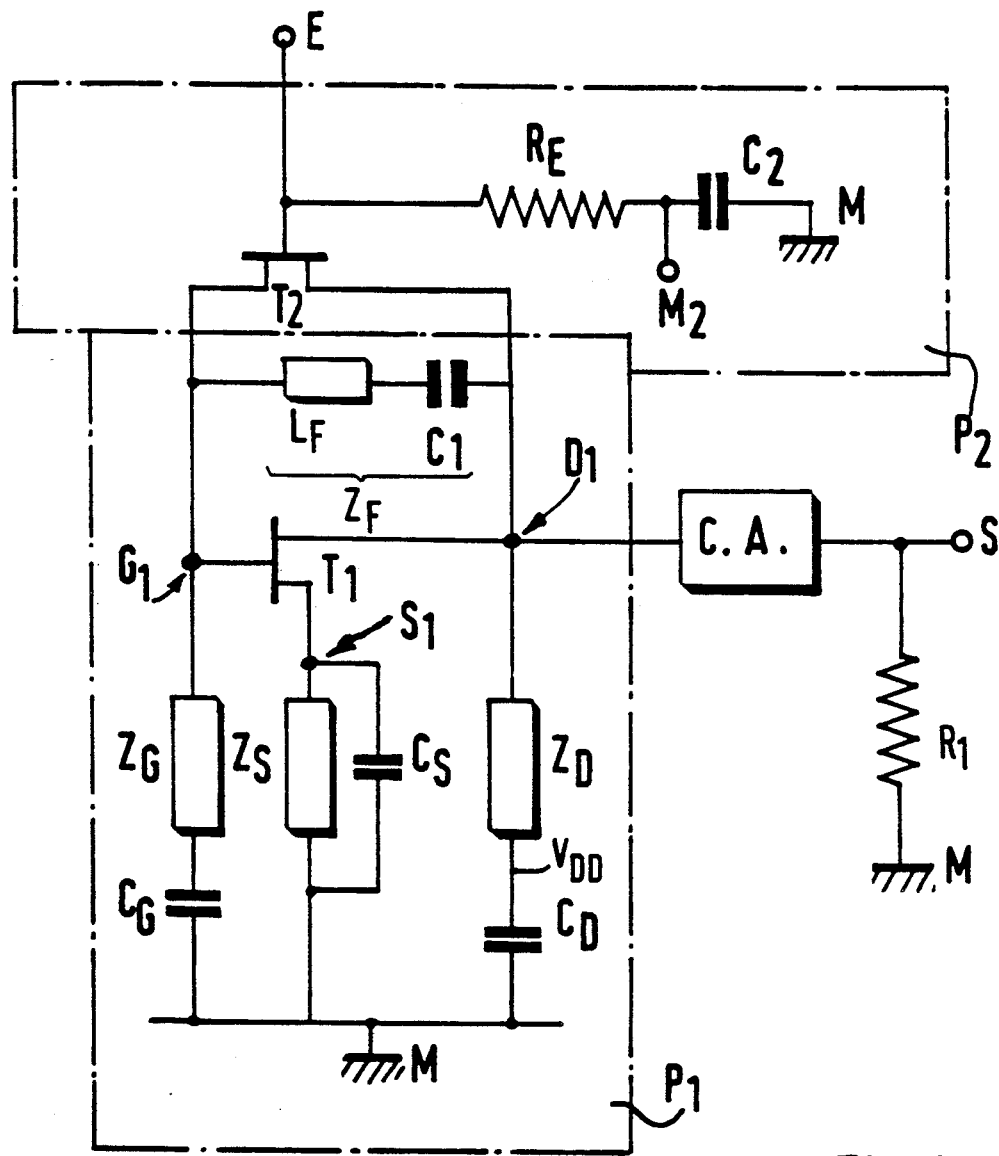
FIG. 1 represents a diagrammatic circuit according to the invention.

As is diagrammatically represented in FIG. 1, the circuit according to the invention comprises a first stage $P_1$ constituted by an oscillator having a field-effect transistor $T_1$ and by a second stage $P_2$ constituted by a field-effect transistor connected as a switch $T_2$. The switch $T_2$ is controlled by a single input signal E of frequency $f_0$ which will be divided by two by the circuit according to the invention.

In order to form an oscillator, the field effect transistor $T_1$ of the stage $P_1$ is equipped with tuning impedances. It comprises a first impedance $Z_G$ connected on the one hand to its gate and on the other hand to ground via a decoupling capacitor $C_G$. It likewise comprises an impedance $Z_D$ connected on the one hand to its drain and on the other hand to ground earth via a decoupling capacitor $C_D$. It also comprises an impedance $Z_S$ (capacitance or inductance) connecting its source directly to ground.

The oscillator stage $P_1$ comprises, in addition to the previously cited tuning impedances, a feedback circuit constructed by means of an impedance $Z_F$ disposed between the gate and the drain of the said transistor $T_1$. This feedback circuit may be an inductance $L_F$, a capacitance or a network including both an inductance and a capacitance. A series decoupling capacitor $C_1$ may be disposed as part of the feedback circuit.

The tuning impedances and the feedback circuit are dimensioned such that together with the transistor $T_1$ as an active element, the impedance Z formed by the transistor $T_1$, the tuning impedances and the feedback circuit has a negative real part $(Z = -R + jX)$ in the relevant frequency domain, which can be called a "negative resistance".

The divider circuit is then constructed based on the fact that a switching transistor $T_2$ of the stage $P_2$ is connected in parallel with this impedance $Z_F$. The stage $T_2$ also comprises a load $R_E$, which may be a resistor, to match the transistor $P_2$ to the generator of the microwave input signal E. This load $R_E$ is disposed between the generator of the signal E and ground. On the other hand, by means of the generator, the microwave signal E is applied to the circuit at the point common to the load $R_E$ and to the control electrode (or gate) of the switching transistor $T_2$ of the stage $P_2$.

In a particularly beneficial variant of the invention, the load $R_E$ may be connected to ground M via a decoupling capacitor $C_2$, a direct biasing voltage then being applied at the point $M_2$, common to the load and to the capacitor, in order to avoid the presence of a residual output signal in the absence of an input signal.

The inverter stage is moreover equipped with a load $R_1$ connected between the drain of the transistor $T_1$ of the stage $P_1$ and ground, the microwave output S then being taken at the drain of this transistor $T_1$.

A power matching circuit, symbolized by the block C.A. in FIG. 1, may also be disposed between the transistor $T_1$ and the load $R_1$ to permit a conversion gain. The output for the microwave signal S then is taken between the matching circuit C.A. and the load $R_1$.

The advantages of the circuit according to the invention will be better understood in view of the following discussion of the principle of operation of this frequency divider.

Let us consider the electrical diagram represented in FIG. 1. Let $\tau_1$ be the delay provided by the transistor $T_1$ of the stage $P_1$, which is loaded by the tuning impedances $Z_G$, $Z_S$ and $Z_D$. This delay $\tau_1$ is, in fact, the sum of the transit time $\tau_0$ in the transistor $T_1$ alone and not loaded and of the mean charging and discharging time of the aforementioned tuning impedances.

Again, let $\tau_2$ be the delay caused by the impedance $Z_F$ connected between the gate and the drain of the transistor $T_1$ of the stage $P_1$, and let $T_0$ be the period of the signal E of input frequency $f_0$.

On the other hand, for the sake of simplification, $\tau_0$ is likewise chosen to be the transit time in the switching transistor $T_2$.

Figure 3:
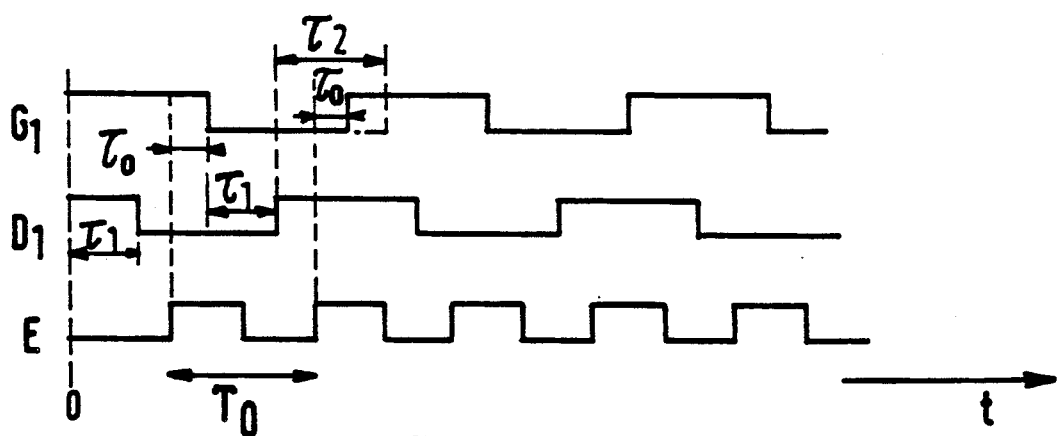
FIG. 3 represents the sequencing of the signals in the circuit.

The diagram of FIG. 3 shows the time waveforms at the points $G_1$ (gate of the transistor $T_1$) and $D_1$ (drain of the transistor $T_1$) of the circuit in relation to the input signal E. The cyclic ratio of the signal E is assumed to be equal to 1.

The diagram of FIG. 3 shows that the two signals at the nodes $G_1$ and $D_1$ are indeed at a frequency which is one half of the frequency of the input signal E. This is true under the conditions where the following relations are satisfied:

$$\tau_0 + \tau_1 > T_0/2 \quad (1)$$

$$\tau_0 + \tau_1 < T_0 \quad (2)$$

The relations (1) and (2) may be expressed in the form of the following relation:

$$T_0/2 < \tau_0 + \tau_1 < T_0 \quad (3)$$

On the other hand, in order for the output frequency S to be one half of the frequency $f_0$ of the input signal E, it is necessary that at the same time the following relation should be satisfied:

$$\tau_0 + \tau_1 + \tau_2 > T_0 + T_0 \quad (4)$$

This amounts to the following condition:

$$T_0/2 < \frac{\tau_1 + \tau_2}{2} \quad (5)$$

The conditions (1) and (2) signify that the signal, after having passed through the transistor $T_2$ and then the transistor $T_1$, must be blocked by the transistor $T_1$. To this end, the latter must then be in its blocked condition. Consequently, it is the input signal E which, by making the transistor $T_2$ conductive, permits the signal which propagates in the circuit to execute once again a circulation in the loop, this signal then being at a frequency which is one half of that of the input signal E.

The condition (4) expresses the fact that the switching transistor $T_2$ cannot remain blocked during a time greater than $(\tau_1 + \tau_2)/2$, since otherwise the impedance $Z_F$ will end up by short circuiting the input $G_1$ with the output $D_1$ of the transistor $T_1$.

As the period $T_0$ is expressed as a function of the frequency $f_0$ of the input signal E by the relation:

$$f_0 = 1/T_0 \quad (6)$$

the relations (1) to (6) set forth hereinabove give rise to the deduction of the following relations:

$$\tfrac{1}{2}(\tau_0 + \tau_1) < f_0 < 1/(\tau_0 + \tau_1) \quad (7)$$

$$1/(\tau_1 + \tau_2) < f_0 \quad (8)$$

$$\tau_2 > \tau_0 \quad (9)$$

Thus, the impedance $Z_F$ disposed between the gate and the drain of the transistor $T_1$ exhibits the advantage of generating a negative resistance and thus permits the transistor $T_1$ to oscillate while the charge of the latter remains low. As the time $\tau_1$ is dependent upon the charge, this time $\tau_1$ may be greatly reduced as compared with the known devices of the prior art. As the maximum input frequency is limited by the time $\tau_1$, and as the time $\tau_1$ is reduced, the maximum input frequency $f_0$max may be considerably increased. For this reason, according to the invention, it is possible to achieve maximum input frequencies greater than 60 GHz, while the prior art did not exceed 30 GHz.

Thus, the quantities known to a person skilled in the art are in particular the maximum oscillation frequency $f_u$ and the transit time $\tau_0$ of the transistor $T_1$. To the first order, a person skilled in the art knows that $f_u$ and $\tau_0$ are connected by the relation: $f_u = 1/2.476 \, \tau_0$ for the transistor $T_1$. Bearing in mind that the minimum delay $\tau_1$ can only be equal to $\tau_0$, the relation (7) permits the deduction of the maximum frequency $f_0$max which it is possible to apply to the divider. The condition of operation is then expressed in the form $$0.619 < f_0 < 1.238 \, f_u \quad (10)$$

Figure 2:
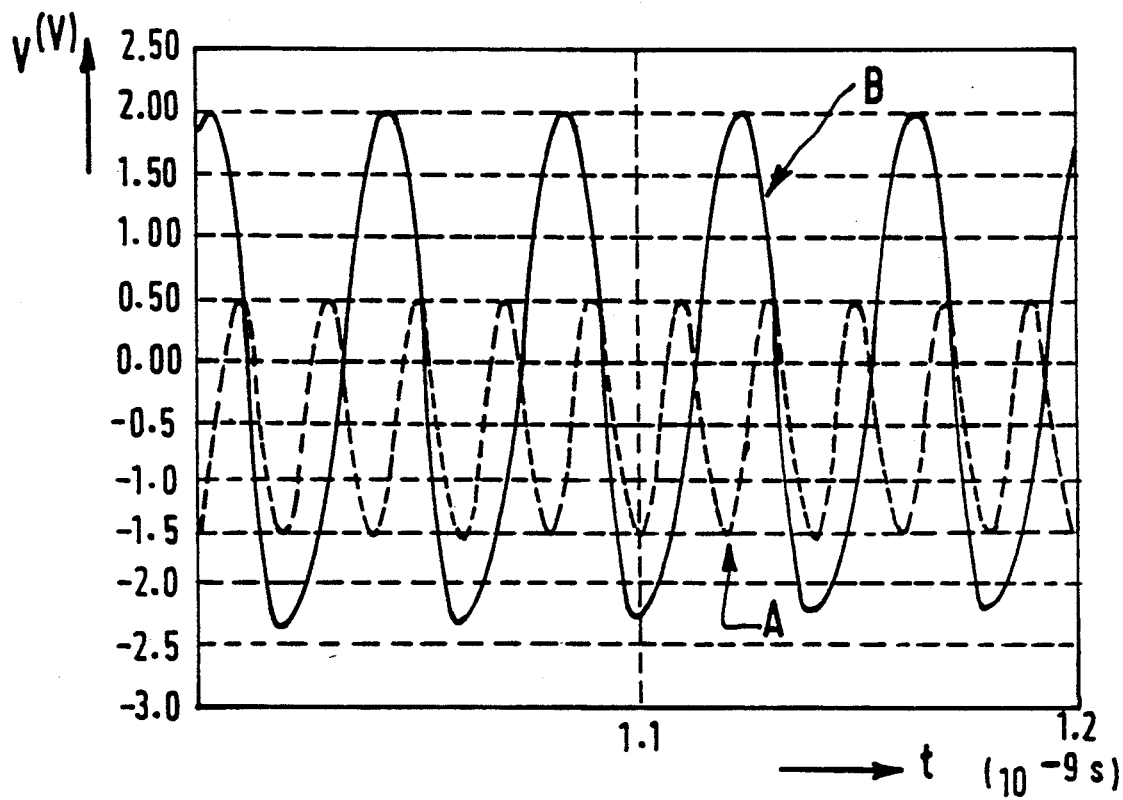
FIG. 2 represents in broken lines, on the curve A, the microwave input signal and, in solid lines, on the curve B, the microwave output signal divided by 2.

FIG. 2 shows, in solid lines by the curve B, the form of the output signal, the amplitude of which is plotted in volts on the ordinate, as a function of the time t, on the abscissa, in $10^{-9}$ s.

The curve A of FIG. 2 shows the form of the input signal with the same units.

In the example represented by FIG. 2, the input signal is at the frequency $f_0 = 50$ GHz (curve A) and the output signal is at the frequency $f_0/2 = 25$ GHz (curve B).

The levels of the input signal (curve A) range from $-1.6$ V to $+0.5$ V. The levels of the output signal (curve B) range from $-2.4$ V to $+2$ V.

The conversion gain $G_C$ is calculated by using the relation: $G_C = P_S/P_E$ where $P_S$ is the power available in the load $R_1$ equal to the square of the effective output voltage $V_S$effi. divided by the load resistance $R_1$; this is written as follows:

$$P_S = V^2_{S \, \text{effi}} / R_1$$
$$= [V_S(\text{high}) - V_S(\text{low})]^2 / 8 \cdot R_1$$

and where $P_E$ is the power available at the terminals of the input resistor $R_E$, which is chosen to be equal to 50 Ω.

$$P_E = [V_E(\text{high}) - V_E(\text{low})]^2 / 8 \times 50$$

In one embodiment of the invention, a selection has been made such that $R_1 = 200$ Ω, and the conversion gain calculated with the aid of the above expressions has the value:

$$G_C = +0.1 \, dB$$

In a favorable manner, the impedances $Z_F$, $Z_G$ and $Z_D$ may be constituted by a localized inductance or by a transmission line of an inductive nature which may then be denoted $L_F$, $L_G$ and $L_D$, respectively. These lines may be deposited on an insulating or semi-insulating substrate, for example. The impedance $Z_S$ may be constituted by a line $L_S$ of equivalent structure, which may or may not be associated with a capacitor $C_S$ connected in parallel therewith.

The circuit may be constructed in a monolithic manner, preferably on a substrate made of gallium arsenide. The transistors are then chosen to be of the type referred to as MESFET, or HEMT, of the depletion type.

Table I given hereinbelow gives the preferred values for the elements suitable for constructing the circuit according to the invention.

Table II given hereinbelow gives the values of the voltages for the operation of the circuit constructed by means of the elements, the characteristics of which are compiled in Table I.

The indication "low" corresponds to the low level of the signals and the indication "high" to the high level of the signals. The reference M designates ground.

The conditions of Table II and the values of the elements from Table I lead to the deduction of the conditions of operation of the circuit, which are:

$$V_3(\text{low}) < -0.9 \, V \text{ and } V_E(\text{high}) > -0.3 \, V$$

TABLE I

| | |
|---|---|
| Length of gate of $T_1 l_g =$ | 0.5 μm |
| Width of gate of $T_1 W_1 =$ | 200 μm |
| Length of gate of $T_2 l_g =$ | 0.5 μm |
| Width of gate of $T_2 W_2 =$ | 20 μm |
| Pinch-off voltage of $T_1$ and $T_2 V_T =$ | $-0.6$ V |
| $L_G = 0.2$ nH | $C_G = 10$ pF |
| $L_D = 2$ nH | $C_D = 10$ pF |
| $L_S = 2$ nH | $C_S = 0.030$ pF |
| $L_F = 0.5$ nH | $C_1 = 10$ pF |
| The frequency of oscillation $f_u = 76$ GHz | |
| The transit time $\tau_0 = 5.3$ ps | |

TABLE II

| |
|---|
| $V_E(\text{low}) < V_G 1, M(\text{low}) + V_T$ to block $T_2$ |
| $V_E(\text{high}) > V_G 1, M(\text{high}) + V_T$ |
| now $V_G 1, M(\text{low}) = V_G 1, S1 = -0.3$ V |
| $V_G 1, M(\text{high}) = V_G 1, S1 = +0.3$ V |
| $V_T = -0.6$ V |
| whence $V_E(\text{low}) < -0.9$ V and $V_E(\text{high}) > -0.3$ V |

We claim:

1. A frequency divide-by-two circuit which comprises: a switching transistor which is controlled by an input signal E at a frequency $f_0$, an inverter transistor coupled to tuning impedances and to a reactive impedance element operative together as a negative resistance thereby to form an oscillator, means connecting the switching transistor in parallel with the reactive impedance element, and wherein the transit time $\tau_0$ of the switching transistor, the delay $\tau_1$ provided by the inverter transistor and tuning impedances, and the transit time $\tau_2$ of a signal propagating through the reactive impedance element are chosen in accordance with the three following relations:

$$\tau_2 > \tau_0$$

$$\frac{1}{2}(\tau_0 + \tau_1) < f_0 < (1/\tau_0 + \tau_1)$$

$$1/(\tau_1 + \tau_2) < f_0$$

2. An integrated semiconductor device including a frequency divide-by-two circuit, which circuit comprises: an inverter stage including an inverter transistor coupled to tuning impedances, a reactive impedance element coupled between a control electrode and a main current electrode of said inverter transistor to form with said inverter transistor and said tuning impedances a network having a negative resistance characteristic, a controlled switch connected in parallel with the reactive impedance element, and means for coupling the switch to an input signal having an input frequency ($f_0$), and wherein the transit time ($\tau_0$) of the switch, the delay time ($\tau_1$) for the propagation of a signal from the control electrode to said main current electrode of the inverter transistor and the delay time ($\tau_2$) of a signal propagating through said reactive impedance element obey the following three relations:

$\tau_2 > \tau_0$;

$(\tau_0 + \tau_1) < [2f_0/(\tau_0 + \tau_1);]\ 1/f_0 < 2(\tau_0 + \tau_1)$ $(\tau_1 + \tau_2) > 1/f_0$;

wherein the delay of the input signal to said main current electrode is greater than one period of said input signal and a feedback delay from said main current electrode to said control electrode is determined by a state of said switch during a later period of said input signal, thereby providing a frequency divide-by-two circuit.

3. A device according to claim 2, wherein the tuning impedances comprise transmission lines.

4. A device according to claim 2, wherein the inverter transistor comprises a field effect transistor and said main current electrode is the drain electrode thereof, and the inverter stage includes a load coupled between the drain of said inverter transistor and ground, an output terminal of said divide-by-two circuit being a junction between said drain and said load.

5. A device according to claim 2 wherein, the inverter transistor comprises a field effect transistor and said main current electrode is the drain electrode thereof and the control electrode is its gate, and the reactive impedance element comprises a transmission line connected between the gate and the drain of the inverter transistor.

6. A device according to claim 2, wherein the inverter transistor comprises a field effect transistor and said main current electrode is the drain electrode thereof and the control electrode is its gate, and wherein the tuning impedance comprises: a first transmission line coupled between said gate of the inverter transistor and ground, a second transmission line coupled between a source of said inverter transistor and ground, and a third transmission line coupled between the drain of said inverter transistor and ground.

7. A device according to claim 6, wherein the inverter stage further includes biasing means comprising a capacitor connected in series with the tuning impedance between the gate of the inverter transistor and ground.

8. A device according to claim 6, further comprising a capacitor connected in series with the third transmission line between the drain of the inverter transistor and ground.

9. A device according to claim 8, further comprising a second capacitor connected in parallel with the second transmission line between the source of the inverter transistor and ground to form a tuning impedance.

10. A device according to claim 9, further comprising a decoupling capacitor connected in series with the reactive impedance element between the gate and the drain of the inverter transistor.

11. A device according to claim 2, characterized in that it is monolithically integrated on a substrate in a technology utilizing field-effect transistors of the type referred to as MESFET or HEMT, of the depletion type, constructed of gallium arsenide.

12. A device according to claim 11, wherein said controlled switch comprises a switching transistor in which the gate width of the inverter transistor is greater than the gate width of the switching transistor, in that their pinch-off voltage ($V_T$) is of the order of $-0.6$ V, and in that the conditions of operation of the circuit are then expressed by the relations.

$V_E(\text{low}) < -0.9\ V$ $V_E(\text{high}) > -0.3\ V$ in which $V_E(\text{low})$ is the low level of the input signal and $V_E(\text{high})$ is the high level of said input signal.

13. A device according to claim 2, wherein a resistor is connected between a control terminal of said controlled switch and ground for matching said control terminal to a generator of the input signal.

14. A device according to claim 2, wherein a control terminal of said switch is connected to ground via a resistor in series with a capacitor, and means for applying a biasing voltage to a common circuit point of said resistor and the capacitor thereby to inhibit a residual signal at an output of the divide-by-two circuit in the absence of an input signal.

15. A device according to claim 2, further comprising a power matching circuit coupled between the main current electrode of the inverter transistor and an output of the divide-by-two circuit, and means coupling a load resistor between said output and ground thereby to provide a conversion gain in the circuit.

16. A device according to claim 2, wherein the inverter stage further comprises biasing means including a generator coupled in series with a tuning impedance between the control electrode of the inverter transistor and ground.

17. A device according to claim 16, wherein a second capacitor is coupled in series with a second tuning impedance connected between the main current electrode of the inverter transistor and ground.

18. A device according to claim 2, wherein the capacitor is coupled in parallel with a tuning impedance coupled between a second main current electrode of the inverter transistor and ground.

19. A device according to claim 2, further comprising a decoupling capacitor coupled in series with the reactive impedance element between said control electrode and said main current electrode of the inverter transistor.

20. A semiconductor integrated circuit frequency divider comprising:
an input terminal for a high frequency input signal at a frequency $f_0$,
an inverter stage which includes an inverter transistor coupled to tuning impedance means,
a reactive impedance means coupled between a control electrode and an output electrode of the inverter transistor and which together with the inverter transistor and the tuning impedance means form a network having a negative impedance characteristic so as to facilitate oscillations in the inverter stage, a switching transistor coupled in parallel with said reactive impedance means and having a control electrode coupled to said input terminal, and wherein the transit time $\tau_2$ of a signal passing through said reactive impedance means is greater than the transit time $\tau_0$ of the switching transistor.

* * * * *